(12) United States Patent
Chen et al.

(10) Patent No.: US 9,923,569 B1
(45) Date of Patent: Mar. 20, 2018

(54) SELF-ADAPTIVE ANALOG-TO-DIGITAL CONVERTER

(71) Applicant: Analog Devices, Inc., Norwood, MA (US)

(72) Inventors: Baozhen Chen, Woburn, MA (US); Lalinda D. Fernando, Westford, MA (US); Frank M. Yaul, Cambridge, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/700,957

(22) Filed: Sep. 11, 2017

(51) Int. Cl.
    *H03M 1/10*     (2006.01)
    *H03M 1/00*     (2006.01)

(52) U.S. Cl.
    CPC ............. *H03M 1/10* (2013.01); *H03M 1/002* (2013.01)

(58) Field of Classification Search
    CPC .... H03M 1/0612; H03M 1/466; H03M 1/201; H03M 1/42; H03M 1/06; H03M 1/1023; H03M 1/203; H03M 1/207; H03M 1/00
    USPC .................. 341/155, 144, 120, 161, 172, 118
    See application file for complete search history.

(56) References Cited

U.S. PATENT DOCUMENTS

| 8,004,448 | B2 | 8/2011 | Carreau | |
| 8,674,862 | B1 * | 3/2014 | Li | H03M 1/10 341/120 |
| 8,787,204 | B2 * | 7/2014 | Ludwig | H04L 41/0896 370/254 |
| 8,902,093 | B1 * | 12/2014 | Leuciuc | H03M 1/1245 341/118 |

OTHER PUBLICATIONS

Maxim Innovation Delivered, "High-Efficiency, Low-Noise Audio Subsystem", MAX97003, (Sep. 1, 2011), 48 pgs.
Tai, Hung-Yen, et al., "Data Converter Techniques", 2014 IEEE International Solid-State Circuits Conference, (Feb. 11, 2014), 3 pgs.
Van Rethy, Jelle, et al., "Predictive sensing in analog-to-digital converters for biomedical applications", IEEE, (2013), 4 pgs.
Waters, Allen, et al., "A ADC Using an LSB First SAR Quantizer", 2015 IEEE, (Sep. 2015), 4 pgs.
Wood, Nicholas, "Predicting ADC: A New Approach for Low Power ADC Design", 2014 IEEE, (Feb. 2014), 4 pgs.
Yaul, Frank, et al., "A 10 bit SAR ADC With Data-Dependent Energy Reduction Using LSB First Successive Approximation", IEEE Journal of Solid-State Circuits, vol. 49, No. 12, (Dec. 2014), 10 pgs.

* cited by examiner

*Primary Examiner* — Jean B Jeanglaude
(74) *Attorney, Agent, or Firm* — Schwegman Lundberg & Woessner, P.A.

(57) ABSTRACT

A self-adaptive SAR ADC techniques that can increase speed and/or decrease its power consumption. In some example approaches, one or more bits from a conversion of a previous sample of an analog input signal can be preloaded onto a DAC circuit of the ADC. If the preloaded bits are determined to be acceptable, bit trials on the current sample can be performed to determine the remaining bits. If not acceptable, the ADC can discard the preloaded bits and perform bit trials on all of the bits. The self-adaptive SAR ADC can include a control loop to adjust, e.g., increase or decrease, the number of bits that are preloaded in a subsequent bit trial using historical data.

20 Claims, 4 Drawing Sheets

SELF-ADAPTIVE ANALOG-TO-DIGITAL CONVERTER

FIELD OF THE DISCLOSURE

This document pertains generally, but not by way of limitation, to integrated circuits, and more particularly, to Analog-to-Digital Converter (ADC) circuits.

BACKGROUND

An analog-to-digital converter (ADC) circuit can be used to convert an analog signal to a digital signal, which can then be further processed or used in the digital domain. A successive approximation routine (SAR) ADC circuit can carry out bit trials to compare portions of the analog signal to a reference voltage to determine the digital bit values of a digital word representing a particular sample of the analog signal. A SAR ADC can use a capacitor array of a Digital-to-Analog Converter (DAC) for carrying out the bit trials for determining the respective digital bit values of the digital word.

SUMMARY OF THE DISCLOSURE

This disclosure presents techniques that can increase the speed of a SAR ADC and/or decrease its power consumption. The present inventors propose a self-adaptive SAR ADC approach in which one or more bits from a conversion of a previous sample of the analog input signal can be preloaded onto a DAC circuit of the ADC. If the preloaded bits are determined to be acceptable, bit trials on the current sample can be performed to determine the remaining bits. If not acceptable, the ADC can discard the preloaded bits and perform bit trials on all of the bits. The self-adaptive SAR ADC can include a control loop to adjust, e.g., increase or decrease, the number of bits that are preloaded in a subsequent bit trial using historical data.

In an aspect, this disclosure is directed to a method of performing an analog-to-digital conversion using a successive approximation register (SAR) analog-to-digital converter (ADC). The method comprises performing bit trials, using a digital-to-analog converter (DAC) circuit of the SAR ADC, to convert a first sample of an analog input signal into an N-bit output; before performing bit trials on a second sample of the analog input signal, preloading M bits of the N-bit output from the first sample onto the DAC circuit, where M is less than N; prior to a conversion, comparing the second sample to a range having an upper bound and a lower bound, wherein the upper bound and lower bound are based on a representation of the preloaded M bits; when the comparison indicates that the second sample is within the range, performing bit trials on the second sample to determine the remaining (N-M) bits; when the comparison indicates that the second sample is not within the range, performing bit trials on the second sample to determine all N bits; and controlling a value of M using at least one result of a previous bit trial.

In an aspect, this disclosure is directed to a method of performing an analog-to-digital conversion using first and second successive approximation register (SAR) analog-to-digital converters (ADC). The method comprises converting a first sample of an analog input signal into an N-bit output; before performing bit trials on a second sample of the analog input signal, preloading at least some of the most significant bits (MSBs) of the N-bit output from the first sample onto a DAC circuit of the first ADC; using the first ADC, comparing the second sample to a first range having a first upper bound and a first lower bound wherein the first upper bound and first lower bound are based on a representation of the preloaded MSBs; when the comparison indicates that the second sample is within the first range, preloading M bits of the N-bit output from the first sample onto a DAC circuit of the second ADC; prior to a conversion, comparing the second sample to a second range having a second upper bound and a second lower bound, wherein the second upper bound and the second lower bound are based on a representation of the preloaded M bits; when the comparison indicates that the second sample is within the second range, performing bit trials on the second sample to determine the remaining (N−M-preloaded MSB) bits; and when the comparison indicates that the second sample is not within the second range, performing bit trials on the second sample to determine the (N-preloaded MSB) bits.

In an aspect, this disclosure is directed to a self-adaptive successive approximation register (SAR) analog-to-digital converter (ADC) comprising: a switched capacitor digital-to-analog converter (DAC) circuit having multiple capacitor elements, each element having a first plate and a second plate and corresponding to a digital bit position, the DAC circuit configured to sample an analog input signal and to convert a first sample of an analog input signal into an N-bit output; and control circuitry. The control circuitry is configured to: perform bit trials, using the DAC circuit, to convert the first sample of the analog input signal into the N-bit output; before performing bit trials on a second sample of the analog input signal, preload M bits of the N-bit output from the first sample onto the DAC circuit, where M is less than N; prior to a conversion, compare the second sample to a range having an upper bound and a lower bound, wherein the upper bound and lower bound are based on a representation of the preloaded M bits; when the comparison indicates that the second sample is within the range, perform bit trials on the second sample to determine the remaining (N−M) bits; when the comparison indicates that the second sample is not within the range, perform bit trials on the second sample to determine all N bits; and control a value of M using at least one result of a previous bit trial.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

A successive approximation routine (SAR) ADC converts an analog signal to a digital word in a successive approximation manner using a binary search. A traditional SAR ADC determines the most significant bit (MSB) first, followed by the MSB-1 bit, the MSB-2 bit, until the least significant bit (LSB). For an N-bit word, the traditional SAR ADC approach uses N bit trial cycles of a digital-to-analog converter (DAC) circuit to determine the N bits. The present inventors have recognized that with this traditional approach, there can be various challenges, including limitations on the speed of the SAR ADC and high power consumption.

This disclosure describes, among other things, techniques that can increase the speed of the SAR ADC and/or decrease its power consumption. As described in detail below, the present inventors propose a self-adaptive SAR ADC approach in which one or more bits from a conversion of a previous sample of the analog input signal can be preloaded onto the DAC circuit. Before performing bit trials on a current sample, the current sample can be compared to a range having an upper bound and a lower bound based on a representation of the preloaded M bits. If the current sample is determined to be within the range, bit trials on the current sample can be performed to determine the remaining bits.

In this manner, a conversion time can be reduced by one or more bit trial cycles, thereby improving the speed of the ADC and reducing its power consumption for small signals and large-but-slowly-changing signals. In the event that the comparison indicates that the current sample is not within the range, the ADC can discard the preloaded bits and instead perform bit trials on all of the bits. The self-adaptive SAR ADC can include a control loop to adjust, e.g., increase or decrease, the number of bits that are preloaded in a subsequent bit trial using historical data.

Figure 1:
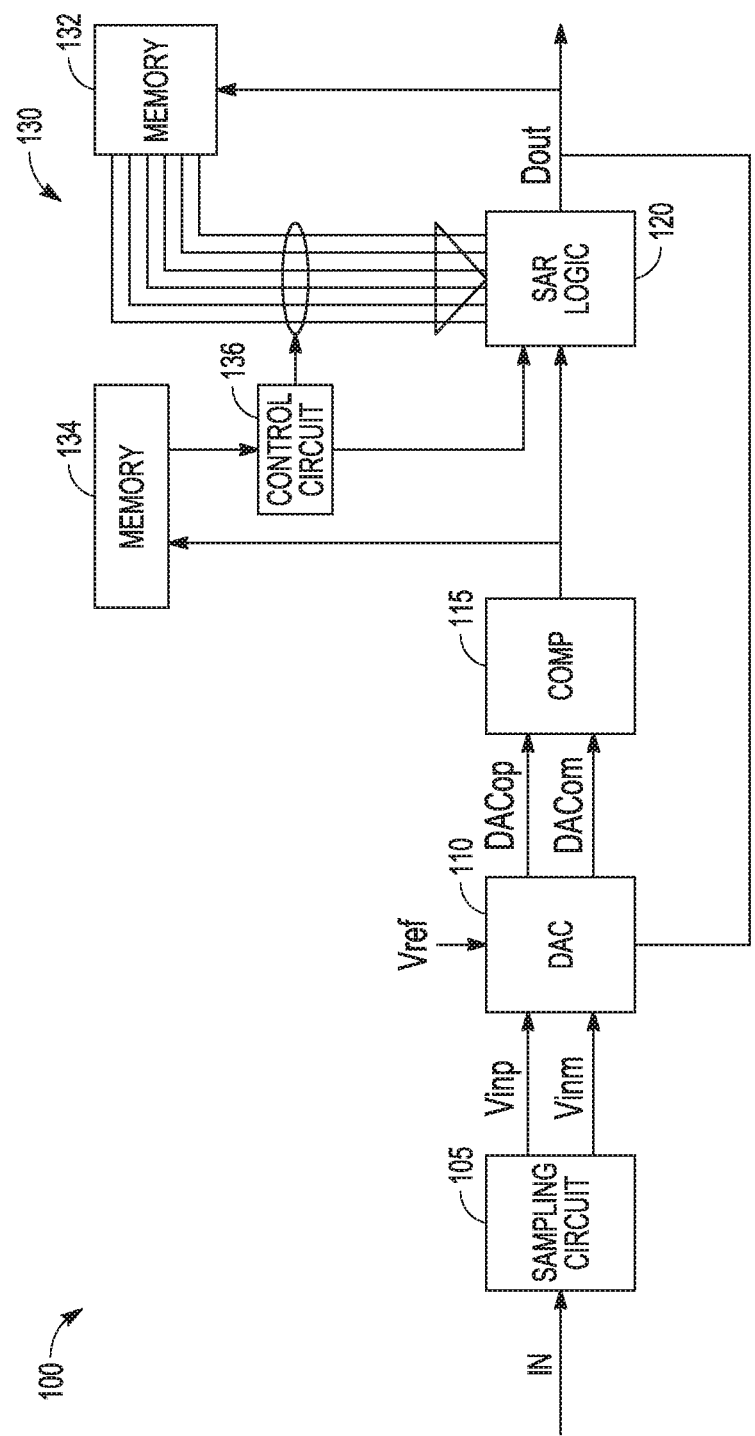
FIG. 1 is a functional block diagram of an example of a SAR ADC that can implement various techniques of this disclosure.

FIG. 1 is a functional block diagram of an example of a SAR ADC 100 that can implement various techniques of this disclosure. In the example, a differential analog input voltage is sampled and held using sampling circuit 105, and a differential output voltage of a DAC circuit 110 is compared to the sampled and held voltage using comparator circuit 115. The bit values of the DAC circuit 110 are adjusted based on the output of the comparator circuit. The conversion can start with the DAC set to midscale. The comparator 115 determines whether the DAC output is greater or less than the sampled input voltage and the result is stored as a one or zero for that bit of the DAC. Conversion then proceeds to the next bit value until all bits of the digital value are determined. One iteration of changing the DAC output and comparing the voltage to the sampled input can be referred to as a bit trial. SAR logic circuitry 120 controls the ADC operation during the bit trials. When the bit trials are complete, the digital value of the sampled and held voltage is available at output Dout.

In some example implementations, the DAC circuit 110 can include two switched capacitor DAC (CDAC) arrays, a first CDAC referred to as "P-DAC" and connected to a non-inverting input of the comparator 115, and a second CDAC referred to as "N-DAC" and connected to an inverting input of the comparator 115. Each CDAC includes a plurality of capacitors, each capacitor having first and second plates.

Each of the capacitors of the CDAC array has an associated switch that is operable to selectively connect a first plate, e.g., the lowermost or "bottom" plate, to either the first reference voltage Vrefp or to the second reference voltage "Vrefn" depending on the bit trial result. Generally Vrefn corresponds to ground and Vrefp is positive relative to Vrefn. In some implementations, the basic SAR algorithm can involve a "Guess→Decide→Set" manner in switching bit trial capacitors. Each bit can be "set", e.g., connected to Vrefp, at the start of that particular bit trial, and based on the bit trial output, that bit setting can be kept or "reset", e.g., connected to Vrefn.

As mentioned above, this disclosure describes, among other things, a self-adaptive SAR ADC approach in which one or more bits from a conversion of a previous sample of the analog input signal can be preloaded onto a DAC circuit of the ADC. If the preloaded bits are determined to be acceptable, bit trials on the current sample can be performed to determine the remaining bits. If not acceptable, the ADC can discharge the preloaded bit trial capacitors and perform bit trials on all of the bits. The self-adaptive SAR ADC can include a control loop to adjust, e.g., increase or decrease, the number of bits that are preloaded in a subsequent bit trial using historical data.

In addition to the SAR logic circuitry 120 and in accordance with various techniques of this disclosure, the control circuitry 130 can further include a first memory circuit 132 coupled to the output of the SAR logic circuitry 120 and configured to store at least one previous digital output result Dour, a second memory circuit 134, e.g., registers, coupled to the output of the comparator 115 and configured to store an indication of success for past conversions, and a preloading width control circuit 136 configured to receive information stored in the second memory circuit 134 and determine and control a bit width to preload.

The SAR ADC 100 of FIG. 1 can receive an analog input signal. Using the DAC circuit 110, the SAR ADC 100 can perform bit trials to convert a first sample of an analog input signal into an N-bit output (Dout), as described above.

In accordance with this disclosure, the control circuitry 130 can store the N-bit output in the first memory circuit 132. Before performing bit trials on a second sample of the analog input signal, the preloading width control circuit 136 can preload M bits of the N-bit output from the first sample onto the DAC circuit 110, e.g., onto capacitor elements of a capacitive DAC, where M is less than N. For example, the SAR logic control circuit 120 can receive a value of M from preloading width control circuit 136 and can preload M bits of the N-bit output from the first sample onto the DAC circuit 110.

By way of a non-limiting specific example, the control circuit can store a 10-bit output in the first memory circuit 132. Before performing bit trials on a second sample of the analog input signal, the SAR logic control circuit 120 can receive a value of M=4 from preloading width (or depth) control circuit 136 and can preload 4 bits (e.g., MSB, MSB-1, MSB-2, and MSB-3) of the 10-bit output from the first sample onto the DAC circuit 110, e.g., onto capacitor elements of a capacitive DAC.

The present inventors have determined that prior to a conversion, it can be desirable to compare the second sample against upper and lower bounds to determine whether it is possible to converge. That is, the preloading width control circuit 136 can compare the second sample to a range having an upper bound and a lower bound that are based on a representation of the preloaded M bits, e.g., the preloaded bits plus offsets. For example, the preloading width control circuit 136 can 1) compare the second sample to an upper bound determined by the preloaded M bits plus a first offset, e.g., positive offset, and 2) compare the second sample to a lower bound determined by the preloaded M bits plus a second offset, e.g., zero offset. The offsets can be provided in using either the digital or analog techniques. In some example analog implementations, the first and second offsets can be provided by switching the remaining (N−M) bits, e.g., capacitors in the DAC circuit 110 or capacitors coupled to the DAC circuit 110, between high and low.

For example, the SAR logic circuitry 120 can set the remaining (N−M) bits after a preload to "high" and the preloading width control circuit 136 can compare the second sample to an upper bound determined by the representation of the preloaded M bits plus the offset provided by the remaining (N−M) bits set to "high". Then, the SAR logic circuitry 120 can set the remaining (N−M) bits to "low" and the preloading width control circuit 136 can compare the second sample to a lower bound determined by the representation of the preloaded M bits plus the offset provided by the remaining (N−M) bits set to "low". In some example implementations, some of the remaining (N−M) bits can be set to "high" and some can be set to "low" in order to provide an upper or lower bound that is less than a maximum upper bound and greater than a lower minimum bound.

When the comparison indicates that the second sample is greater than the lower bound and less than the upper bound, then the second sample is within the range and the binary search will converge upon a digital output for the conversion. When the preloading width control circuit 136 determines from the comparison that the second sample is within the range, the SAR logic circuitry 120 can perform bit trials on the second sample to determine the remaining (N−M) bits. In this manner, the SAR ADC can save M bit trial cycles as a result of the preloaded M bits. Continue with the non-limiting specific example above, the SAR logic circuitry 120 can perform bit trials on the second sample to determine the remaining 6 bits of the 10-bit output, thereby saving 4 bit trial cycles.

If the comparison indicates that the second sample is greater than the upper bound or less than the lower bound, then the second sample is not within the range and the binary search will not converge upon a digital output for the conversion. When the preloading width control circuit 136 determines from the comparison that the second sample is not within the range, the SAR logic circuitry 120 cannot use the preloaded bits. Instead, the SAR logic circuitry 120 can perform bit trials on the second sample to determine all N bits.

In addition, as mentioned above, the SAR ADC 100 of FIG. 1 can be self-adaptive. In particular, the SAR ADC can include a control loop to control, e.g., increase or decrease, the number of M bits that are preloaded in a subsequent bit trial using historical data. For example, for at least some previous samples, the preloading width control circuit 136 can store data in the second memory circuit 134, e.g., registers, representing a result of the comparison of the preloaded M bits to a respective sample. Using the stored data, the preloading width control circuit 136 can control a value of M.

As an example, the preloading width control circuit 136 can store data in the second memory circuit 134, e.g., registers, representing the results of the comparison of the preloaded M bits to a K previous samples. The preloading width control circuit 136 can determine an indication of success using the stored data and can select the value of M from a set of values of M based on the indication of success.

In some examples, the preloading width control circuit 136 can compare the number of successful results stored in the second memory 134 against the total number of stored K previous samples to determine an indication of success. In other examples, the preloading width control circuit 136 can compare the number of unsuccessful results stored in the second memory 134 against the total number of stored K previous samples to determine an indication of success. In some examples, the preloading width control circuit 136 can compare the number of successful results stored in the second memory 134 against the number of unsuccessful results to determine an indication of success.

Based on the indication of success, the preloading width control circuit 136 can select a lower value of M if the indication of success is below a first threshold and can select a higher value of M if the indication of success is above a second threshold. In some examples, the first and second thresholds can be the same value. In other examples, the first and second threshold can be different values to provide hysteresis.

By way of a non-limiting specific example, preloading width control circuit 136 can store the results of 20 previous comparisons of preloaded M bits to previous samples in the second memory circuit 134. For example, a success could be stored in a register as a "1" and a fail could be stored as a "0". As an example, if there were 15 successes and 5 fails, the preloading width control circuit 136 can compare the number of successful results (15) against the total number of stored previous samples (20) to determine an indication of success of 75%. Assuming a first threshold of 45% and a second threshold of 55%, the preloading width control circuit 136 can select a higher value of M because the indication of success is above the second threshold. For example, assuming that M was initially set to 4, the preloading width control circuit 136 can select a value of 8, for example, so that more bits can be preloaded. In this manner, the ADC 100 can adapt its preloading bit width using historical data, without user control and, as such, is self-adaptive.

In some example implementations, instead of storing data in the second memory circuit 134, e.g., registers, representing just the results of the comparison of the preloaded M bits to a number of K previous samples, the preloading width control circuit 136 can additionally or alternatively compute and store data representing the maximum value of M that would have resulted in the sample falling in the range of the preloaded M bits, which is referred to in this disclosure as "M_best". The value of M_best can be computed for one or more previous samples based on the digitized values of those samples.

In one example implementation, after the conversion and using the previous sample value and the current sample value, the preloading width control circuit 136 can determine M_best by determining how many bits could have been preloaded from the previous sample value while keeping the current sample value within the range of the preloaded bits. The preloading width control circuit 136 can store values of M_best for several samples in the second memory circuit 134. As described below, the ADC 100 can adapt its preloading bit width M using the stored values of M_best.

In some examples, the preloading width control circuit 136 can set a next value of M to the minimum M_best over the previous K samples. In other examples, the preloading width control circuit 136 can set a next value of M to the M value that would have minimized total bit trials over the previous K samples. The total bit trials required for the previous K samples when preloading M bits can be computed based on the stored values of M_best.

In some examples, if the next higher value of M would have had an indication of success rate above a threshold for the previous K samples, the preloading width control circuit 136 can increment M to that next higher value. In other examples, if the next lower value of M would have yielded a lower total number of bit trials than the current value of M over the previous K samples, the preloading width control circuit 136 can decrement M to that lower value.

Figure 2:
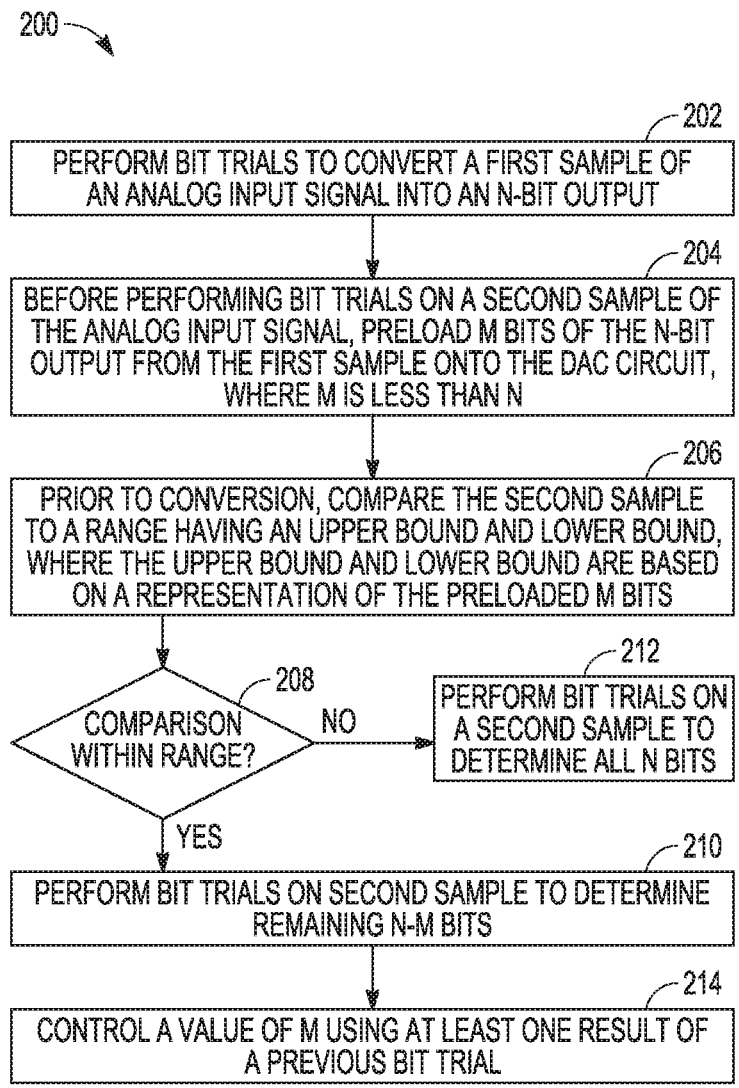
FIG. 2 is a flow diagram depicting an example of a method of operating a successive approximation register (SAR) analog to digital converter (ADC) integrated circuit device.

FIG. 2 is a flow diagram depicting an example of a method 200 of operating a successive approximation register (SAR) analog to digital converter (ADC) integrated circuit device. At block 202, an ADC, e.g., ADC 100 of FIG. 1, can perform bit trials, e.g., using the DAC circuit 110 of FIG. 1, to convert a first sample of an analog input signal into an N-bit output, e.g., 10-bit. At block 204, before performing bit trials on a second sample of the analog input signal, a SAR logic control circuit, e.g., SAR logic 120 of FIG. 1, can receive a value of M from a preloading width control circuit, e.g., circuit 136 of FIG. 1, and can preload M bits, e.g., 4 bits, of the N-bit output, e.g., 10 bits, from the first sample onto the DAC circuit.

At block 206, prior to a conversion, a preloading width control circuit, e.g., circuit 136 of FIG. 1, can compare the second sample to a range having an upper bound and a lower bound, wherein the upper bound and lower bound are based on a representation of the preloaded M bits. For example, the preloading width control circuit 136 can 1) compare the second sample to an upper bound determined by the representation of the preloaded M bits plus a first offset, e.g., positive offset, and 2) compare the second sample to a lower bound determined by the representation of the preloaded M bits plus a second offset, e.g., zero offset.

At block 208, when the comparison indicates that the second sample is within the range ("YES" branch of block 208), the SAR logic circuitry can perform bit trials on the second sample to determine the remaining (N–M) bits (block 210). When the comparison indicates that the second sample is not within the range ("NO" branch of block 208), the SAR logic circuitry can perform bit trials on the second sample to determine all N bits (block 212).

If the comparison indicates that the second sample is greater than the lower bound and less than the upper bound, then the second sample is within the range and the binary search will converge upon a digital output for the conversion. When the preloading width control circuit 136 determines from the comparison that the second sample is within the range, the SAR logic circuitry 120 can perform bit trials on the second sample to determine the remaining (N–M) bits. In this manner, the SAR ADC can save M bit trial cycles as a result of the preloaded M bits. Continue with the non-limiting specific example above, the SAR logic circuitry 120 can perform bit trials on the second sample to determine the remaining 6 bits of the 10-bit output, thereby saving 4 bit trial cycles.

If the comparison indicates that the second sample is greater than the upper bound or less than the lower bound, then the second sample is not within the range and the binary search will not converge upon a digital output for the conversion. When the preloading width control circuit 136 determines from the comparison that the second sample is not within the range, the SAR logic circuitry 120 cannot use the preloaded bits. Instead, the SAR logic circuitry 120 can perform bit trials on the second sample to determine all N bits. At block 214, the preloading width control circuit 136 can control (or self-adjust) a value of M using at least one result of a previous bit trial, using one or more of the various techniques described above.

Using various techniques of this disclosure, a conversion time can be reduced by one or more bit trial cycles by predicting M from a previous sample. In some implementations, it can be desirable to use the reduction in time to increase the speed and reduce the power consumption of the ADC. In other implementations where speed and power consumption is less of an issue, the bit trial cycles saved by predicting M can be used to increase the signal-to-noise ratio of the sample. For example, the comparator, e.g., comparator 115 of FIG. 1, can perform multiple comparisons on the same DAC voltage, and the comparator outputs can be averaged together to reduce the comparator thermal noise.

In some implementations, it can be desirable to use the reduction in time to perform background calibration of ADC bit weights in order to improve linearity. Higher accuracy ADCs may need repeated calibration to ensure that the ADC is compensated for capacitor voltage coefficient temperature drift and offset drift, for example.

Background calibration works in the background and can be transparent to the normal ADC operation during which analog-to-digital signal conversions are ongoing. Also, because background calibration works in the background of normal operation, it may track the effects of supply and temperature on the ADC bit weights.

One background calibration approach is to use one or more redundant ADC channels. However, such an approach can result in added hardware, power consumption, and complexity.

In another approach, the same sample can be converted twice, and the capacitor(s) being calibrated can be modulated after the first conversion. For example, dither can be added after the first conversion to determine a second result. In another example, rather than adding dither, the DAC elements, e.g., capacitors, etc., within a DAC element array, can be "shuffled" and regrouped, and then selected to receive a reference voltage. Using either of these approaches, the difference between the results of the first and second conversions can contain the error information that can be used for calibration, and the signal component can be removed by this process.

In accordance with this disclosure, any bit trial cycles saved by predicting M from a previous sample can be used to perform background calibration after the ADC converges to N bit accuracy, for example. For example, if 6 bit trial cycles were saved in the conversion time (as compared to a conventional conversion process), at least some of these bit trial cycles can be used to convert the sample again after adding dither or shuffling and regrouping the DAC elements. The control circuitry can determine a difference between the results of the first and second conversions, which can contain the error information that can be used for calibration, and the signal component can be removed by this process.

The present inventors have also recognized the desirability of using both a main ADC and an auxiliary ADC (or "mini ADC"). The mini ADC can provide low resolution using a smaller sampling capacitor and a low power, relatively noise comparator, and a main ADC can provide for high resolution.

A mini-ADC can help convert higher input voltage ranges using a low voltage supply and can allow the main ADC to power down its comparator during the acquisition phase. The mini-ADC can convert the input voltage to, for example, 2-bit accuracy using a binary search algorithm. The mini-ADC can perform this conversion before the main ADC takes any action. Then, the mini-ADC can transfer the results of the low-resolution conversion to the main ADC, which can then resolve the remaining bits.

For a conventional binary-search ADC, an initial guess is Vref/2, so the maximum error in the initial guess is Vref/2. However, using the predictive ADC of this disclosure, the initial guess could possibly be Vref, while the actual input voltage could be 0, yielding twice the maximum error. As such, the present inventors have recognized that it can be desirable to use a mini-ADC to prevent the main ADC from having an initial guess that is too far off from the actual input voltage. If that were to happen, the voltage on certain nodes in the DAC of the main ADC could go out of bounds, causing accuracy issues and possibly overvoltaging transistors.

Figure 3:
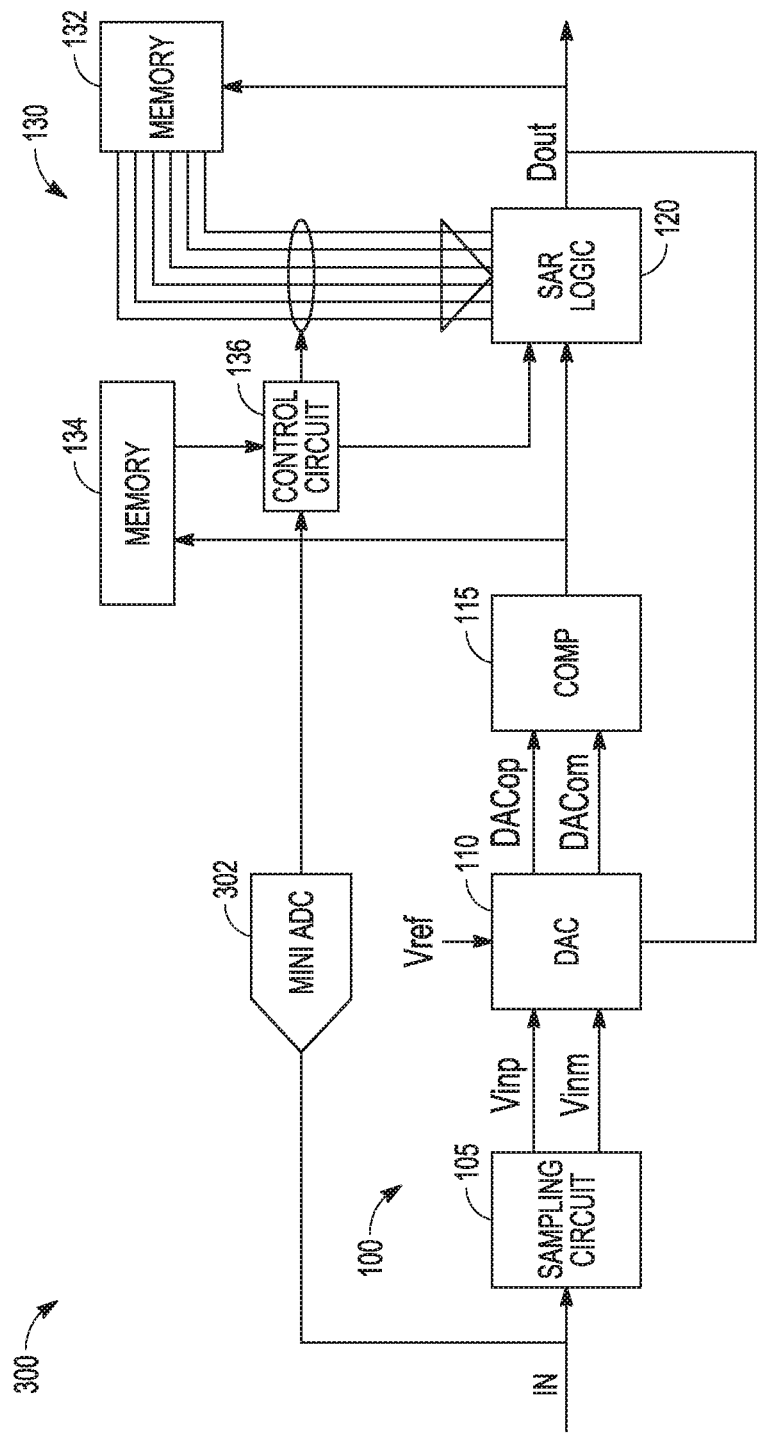
FIG. 3 is a functional block diagram of an example of an ADC having a main ADC and an auxiliary ADC.

FIG. 3 is a functional block diagram of an example of an ADC system 300 having a main ADC 100 and an auxiliary ADC 302. The main ADC circuit 100 includes features similar to those described above with respect to FIG. 1 and, for purposes of conciseness, those features will not be described in detail again. The mini-ADC circuit 302 can be coupled between an input IN of the main ADC 100 and the preloading width control circuit 136.

Similar to what was described above and in accordance with this disclosure, the system 300 can convert a first sample of an analog input signal into an N-bit output and the control circuitry 130 can store the N-bit output in the first memory circuit 132.

Before performing bit trials on a second sample of the analog input signal, the preloading width control circuit 136 can preload at least some of the MSBs from the first sample onto a DAC circuit in the mini-ADC 302, e.g., onto capacitor elements of a capacitive DAC. It can be desirable to compare the second sample against upper and lower bounds to determine whether it is possible to converge. That is, the preloading width control circuit 136 can compare the second sample to a range having an upper bound and a lower bound that are based on a representation of the preloaded MSBs, e.g., the preloaded MSBs plus offsets.

For example, the preloading width control circuit 136 can 1) compare the second sample to an upper bound determined by the preloaded MSBs plus a first offset, e.g., positive offset, and 2) compare the second sample to a lower bound determined by the preloaded MSBs plus a second offset, e.g., zero offset. In some examples, the first and second offsets can be provided by switching the remaining (N–M) bits, e.g., capacitors in the DAC circuit of the mini-ADC 302, between high and low.

When the comparison indicates that the second sample is less than the lower bound or greater than the upper bound, then the second sample is not within the range defined by the MSBs plus an offset and the binary search will not converge upon a digital output for the conversion. As a result, the system 300 can perform a full SAR conversion to determine a result.

When the comparison indicates that the second sample is greater than the lower bound and less than the upper bound, then the second sample is within the range defined by the MSBs plus an offset and the binary search will converge upon a digital output for the conversion. When the comparison indicates that the second sample is within the range, the preloading width control circuit 136 can preload M bits of the N-bit output from the first sample onto the DAC circuit 110 of the main ADC 100. For example, the preloading width control circuit 136 can transfer the charge from a capacitive DAC of the mini-ADC to the capacitive DAC of the main ADC, thereby preloading the MSBs that had been preloaded onto the mini-ADC 302. Then, the preloading width control circuit 136 can preload additional bits after the mini-ADC MSB bits such that M bits of the N-bit output are now preloaded onto the DAC of the main ADC.

Similar to what was described above, prior to a conversion, the preloading width control circuit 136 can compare the second sample to another range having an upper bound and a lower bound, where the upper bound and the lower bound are based on a representation of the preloaded M bits, e.g., the preloaded M bits plus offsets. When the comparison indicates that the second sample is greater than the lower bound and less than the upper bound, then the second sample is within the range and the binary search will converge upon a digital output for the conversion. When the preloading width control circuit 136 determines from the comparison that the second sample is within the range, the SAR logic circuitry 120 can perform bit trials on the second sample to determine the remaining bits. In this manner, the SAR ADC can save M bit trial cycles as a result of the preloaded M bits.

When the comparison indicates that the second sample is not within the range, the SAR logic circuitry 120 can discard the bits after the MSB bits that were preloaded and perform bit trials on the second sample starting with the bit following the last bit preloaded from the mini-ADC 302.

In addition, as mentioned above, the SAR ADC 100 of FIG. 1 can be self-adaptive. In particular, the SAR ADC can include a control loop to control, e.g., increase or decrease, the number of M bits that are preloaded in a subsequent bit trial using historical data, as described above, which for purposes of conciseness, will not be described in detail again.

Figure 4:
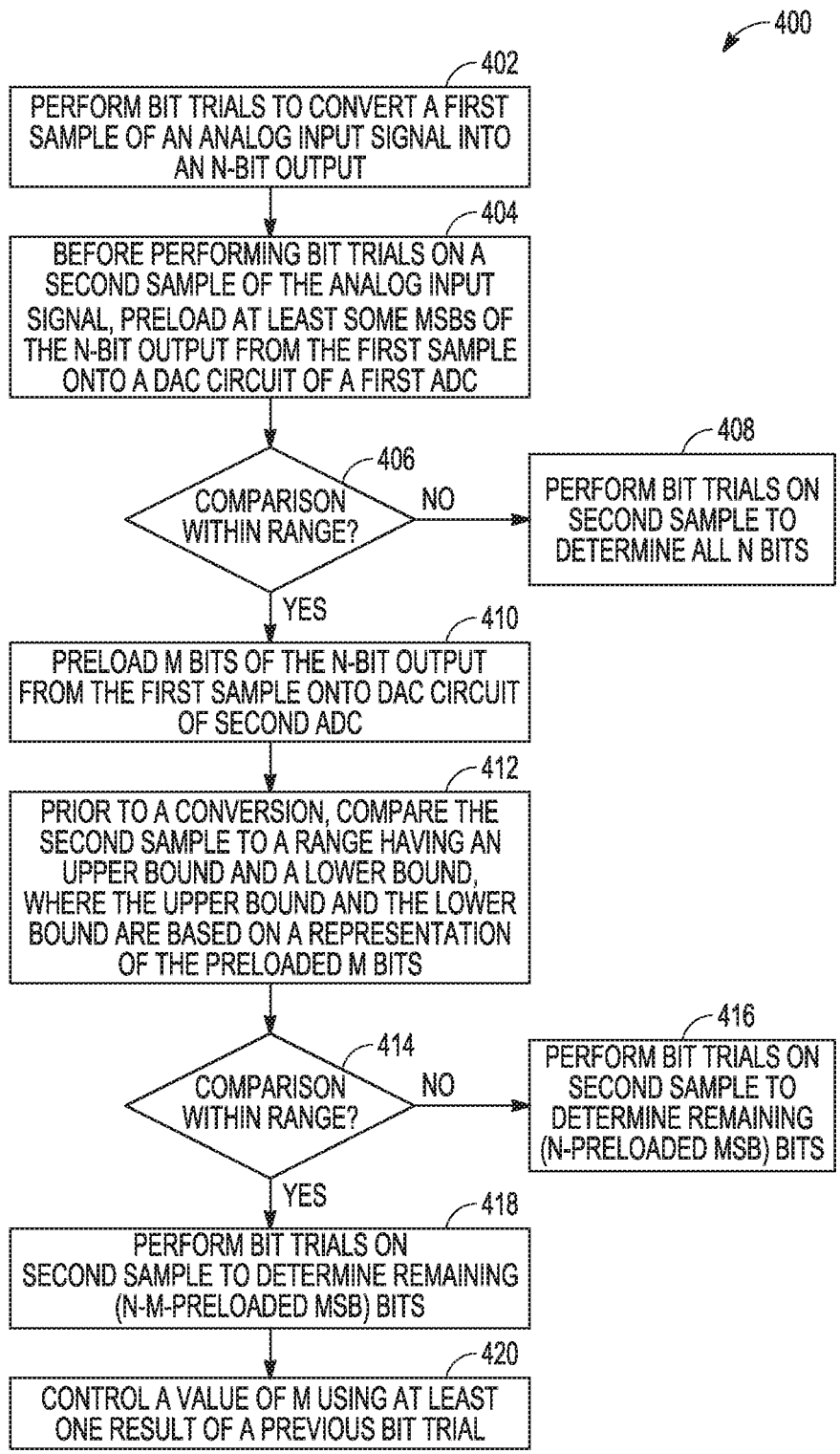
FIG. 4 is a flow diagram depicting an example of a method of operating a successive approximation register (SAR) analog to digital converter (ADC) integrated circuit device ADC having a main ADC and an auxiliary ADC.

FIG. 4 is a flow diagram depicting an example of a method 400 of operating a successive approximation register (SAR) analog to digital converter (ADC) integrated circuit device ADC having a main ADC and an auxiliary ADC. At block 402, an ADC system, e.g., system 300 of FIG. 3, can perform bit trials, e.g., using the DAC circuit 110 of FIG. 3, to convert a first sample of an analog input signal into an N-bit output, e.g., 10-bit. At block 404, before performing bit trials on a second sample of the analog input signal, a SAR logic control circuit, e.g., SAR logic 120 of FIG. 3, can preload at least some of the MSBs of the N-bit output from the first sample onto the DAC circuit of a mini-ADC, e.g., the mini-ADC of FIG. 3.

At block 406, the preloading width control circuit 136 can compare the second sample to a first range having an upper bound and a lower bound that are based on a representation of the preloaded MSBs, e.g., the preloaded MSBs plus offsets. When the comparison is not within the first range ("NO" branch of decision block 406), then the binary search will not converge upon a digital output for the conversion and the system, e.g., system 300 of FIG. 3, can perform bit trials on the second sample to determine all N bits (block 408). When the comparison indicates that the second sample is within the range ("YES" branch of decision block 406), the preloading width control circuit 136 can preload M bits of the N-bit output from the first sample onto the DAC circuit 110 of the main ADC 100 (block 410).

For example, the control circuit 130 of FIG. 3 can transfer the charge from a capacitive DAC of the mini-ADC 302 of FIG. 4 to the capacitive DAC of the main ADC 100 of FIG. 3, thereby preloading the MSBs that had been preloaded onto the mini-ADC 302. Then, the preloading width control circuit 136 can preload additional bits after the MSBs such that M bits of the N-bit output are now preloaded onto the DAC of the main ADC.

At block 412, prior to a conversion, the preloading width control circuit 136 can compare the second sample to a second range having an upper bound and a lower bound, where the second upper bound and the second lower bound are based on a representation of the preloaded M bits, e.g., the preloaded M bits plus offsets.

When the preloading width control circuit 136 determines from the comparison that the second sample is not within the range ("NO" branch of decision block 414), the SAR logic circuitry 120 can discard the bits after the MSB bits that were preloaded and then perform bit trials on the second sample starting with the bit following the last bit preloaded from the mini-ADC (block 416). In other words, the SAR logic circuitry 120 can determine the remaining (N-(preloaded MSB)) bits.

When the comparison indicates that the second sample is greater than the lower bound and less than the upper bound, the preloading width control circuit 136 determines from the comparison that the second sample is within the range ("YES" branch of decision block 414) and the SAR logic circuitry 120 can perform bit trials on the second sample to determine the remaining (N−M-(preloaded MSB)) bits (block 418). In this manner, the SAR ADC can save bit trial cycles as a result of the preloaded M bits.

At block 420, the preloading width control circuit 136 can control (or self-adjust) a value of M using at least one result of a previous bit trial, using one or more of the various techniques described above.

In addition, any bit trial cycles saved using the techniques of FIG. 4 can be used to increase SNR or perform background calibration techniques, as described above.

Various Notes

Each of the non-limiting aspects or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "aspects" or "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like. The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A method of performing an analog-to-digital conversion using a successive approximation register (SAR) analog-to-digital converter (ADC), the method comprising:
   performing bit trials, using a digital-to-analog converter (DAC) circuit of the SAR ADC, to convert a first sample of an analog input signal into an N-bit output;
   before performing bit trials on a second sample of the analog input signal, preloading M bits of the N-bit output from the first sample onto the DAC circuit, where M is less than N;
   prior to a conversion, comparing the second sample to a range having an upper bound and a lower bound, wherein the upper bound and lower bound are based on a representation of the preloaded M bits;

when the comparison indicates that the second sample is within the range, performing bit trials on the second sample to determine the remaining (N–M) bits;
when the comparison indicates that the second sample is not within the range, performing bit trials on the second sample to determine all N bits; and
controlling a value of M using at least one result of a previous bit trial.

2. The method of claim 1, further comprising:
when the comparison indicates that the second sample is within the range, performing additional bit trials on the second sample using one or more remaining clock cycles of a preset number of clock cycles to convert the second sample to increase a signal-to-noise ratio.

3. The method of claim 1, further comprising:
when the comparison indicates that the second sample is within the range, after the ADC converges to N bit accuracy, performing additional bit trials using one or more remaining clock cycles to perform ADC background calibration.

4. The method of claim 1, wherein comparing the second sample to a range having an upper bound and a lower bound, wherein the upper bound and lower bound are based on a representation of the preloaded M bits includes:
comparing the second sample to an upper bound determined by the representation of the preloaded M bits plus a first offset; and
comparing the second sample to a lower bound determined by the representation of the preloaded M bits plus a second offset.

5. The method of claim 1, further comprising:
for at least some previous samples, storing data representing a result of the comparison of the preloaded M bits to the respective sample; and
controlling the value of M using the stored data.

6. The method of claim 5, further comprising:
determining an indication of success using the stored data, wherein controlling the value of M using the stored data includes:
selecting the value of M from a set of values of M based on the indication of success.

7. The method of claim 6, wherein selecting the value of M from a set of values of M based on the indication of success includes:
selecting a lower value of M if the indication of success is below a first threshold; and
selecting a higher value of M if the indication of success is above a second threshold.

8. The method of claim 1, further comprising:
for at least some previous samples, storing data representing a maximum value of M ("M_best") that results in a respective sample being within the range, wherein M_best is computed based on a sequence of values of the previous samples; and
controlling the value of M for the next conversion using the stored data representing M_best.

9. A method of performing an analog-to-digital conversion using first and second successive approximation register (SAR) analog-to-digital converters (ADC), the method comprising:
converting a first sample of an analog input signal into an N-bit output;
before performing bit trials on a second sample of the analog input signal, preloading at least some of the most significant bits (MSBs) of the N-bit output from the first sample onto a DAC circuit of the first ADC;
using the first ADC, comparing the second sample to a first range having a first upper bound and a first lower bound wherein the first upper bound and first lower bound are based on a representation of the preloaded MSBs;
when the comparison indicates that the second sample is within the first range, preloading M bits of the N-bit output from the first sample onto a DAC circuit of the second ADC;
prior to a conversion, comparing the second sample to a second range having a second upper bound and a second lower bound, wherein the second upper bound and the second lower bound are based on a representation of the preloaded M bits;
when the comparison indicates that the second sample is within the second range, performing bit trials on the second sample to determine the remaining (N–M–preloaded MSB) bits; and
when the comparison indicates that the second sample is not within the second range, performing bit trials on the second sample to determine the (N–preloaded MSB) bits.

10. The method of claim 9, further comprising:
when the comparison indicates that the second sample is within the second range, performing additional bit trials on the second sample using one or more remaining clock cycles of a preset number of clock cycles to convert the second sample to increase a signal-to-noise ratio.

11. The method of claim 10, further comprising:
for at least some previous samples, storing data representing a result of the comparison of the preloaded M bits to the respective sample; and
controlling a value of M using the stored data.

12. The method of claim 11, further comprising:
determining an indication of success using the stored data, wherein controlling a value of M using the stored data includes:
selecting the value of M from a set of values of M based on the indication of success.

13. The method of claim 12, wherein selecting the value of M from a set of values of M based on the indication of success includes:
selecting a higher value of M if the indication of success is below a threshold; and
selecting a lower value of M if the indication of success is above the threshold.

14. The method of claim 12, wherein preloading M bits of the N-bit output from the first sample onto a DAC circuit of the second ADC includes:
preloading at least some of the M bits of N-bit output using at least some of the MSBs from the DAC circuit of the first ADC.

15. The method of claim 12, wherein the first ADC has a lower resolution than the second ADC.

16. A self-adaptive successive approximation register (SAR) analog-to-digital converter (ADC) comprising:
a switched capacitor digital-to-analog converter (DAC) circuit having multiple capacitor elements, each element having a first plate and a second plate and corresponding to a digital bit position, the DAC circuit configured to sample an analog input signal and to convert a first sample of an analog input signal into an N-bit output; and control circuitry configured to:
  perform bit trials, using the DAC circuit, to convert the first sample of the analog input signal into the N-bit output;
  before performing bit trials on a second sample of the analog input signal, preload M bits of the N-bit output from the first sample onto the DAC circuit, where M is less than N;
  prior to a conversion, compare the second sample to a range having an upper bound and a lower bound, wherein the upper bound and lower bound are based on a representation of the preloaded M bits;
  when the comparison indicates that the second sample is within the range, perform bit trials on the second sample to determine the remaining (N−M) bits;
  when the comparison indicates that the second sample is not within the range, perform bit trials on the second sample to determine all N bits; and
  control a value of M using at least one result of a previous bit trial.

17. The self-adaptive successive approximation register (SAR) analog-to-digital converter (ADC) of claim 16, wherein when the comparison indicates that the second sample is within the range, the control circuitry is further configured to:
  perform additional bit trials on the second sample using one or more remaining clock cycles of a preset number of clock cycles to convert the second sample to increase a signal-to-noise ratio.

18. The self-adaptive successive approximation register (SAR) analog-to-digital converter (ADC) of claim 16, wherein when the comparison indicates that the second sample is within the range, after the ADC converges to N bit accuracy, the control circuitry is further configured to:
  perform additional bit trials using one or more remaining clock cycles to perform ADC background calibration.

19. The self-adaptive successive approximation register (SAR) analog-to-digital converter (ADC) of claim 16, wherein the control circuitry configured to compare the second sample to a range having an upper bound and a lower bound, wherein the upper bound and lower bound are based on a representation of the preloaded M bits is configured to:
  compare the second sample to an upper bound determined by the representation of the preloaded M bits plus a first offset; and
  compare the second sample to a lower bound determined by the representation of the preloaded M bits plus a second offset.

20. The self-adaptive successive approximation register (SAR) analog-to-digital converter (ADC) of claim 16, wherein the control circuitry is further configured to:
  for at least some previous samples, store data representing a result of the comparison of the preloaded M bits to the respective sample; and
  control the value of M using the stored data.

* * * * *